United States Patent [19]

Phillips

[11] Patent Number: 5,576,651

[45] Date of Patent: Nov. 19, 1996

[54] STATIC/DYNAMIC FLIP-FLOP

[75] Inventor: Larry B. Phillips, Austin, Tex.

[73] Assignee: International Business Machines Corporation, Armonk, N.Y.

[21] Appl. No.: 449,410

[22] Filed: May 22, 1995

[51] Int. Cl.⁶ .......................... H03K 3/356; H03K 3/037
[52] U.S. Cl. .......................... 327/202; 327/203; 327/208; 327/211
[58] Field of Search ..................... 327/199–203, 327/205, 206, 208–215, 217, 219, 223, 225; 371/22.3

[56] References Cited

U.S. PATENT DOCUMENTS

| | | | |
|---|---|---|---|
| 3,812,388 | 5/1974 | Southworth | 307/291 |
| 3,855,460 | 12/1974 | Sado | 235/156 |
| 4,493,077 | 1/1985 | Agrawal et al. | 371/25 |
| 4,554,664 | 11/1985 | Schultz | 371/25 |
| 4,581,739 | 4/1986 | McMahon, Jr. | 372/21 |
| 4,630,270 | 12/1986 | Petit et al. | 371/29 |
| 4,730,132 | 3/1988 | Wantanabe et al. | 307/446 |
| 4,771,187 | 9/1988 | Kawamura | 327/212 |
| 4,800,300 | 1/1989 | Walters et al. | 327/210 |
| 4,808,840 | 2/1989 | Chung et al. | 307/290 |
| 4,974,226 | 11/1990 | Fujimori et al. | 371/22.3 |
| 5,001,371 | 3/1991 | Mahabadi | 327/205 |
| 5,003,513 | 3/1991 | Porter et al. | 327/208 |
| 5,012,246 | 4/1991 | Chung et al. | 341/160 |
| 5,130,647 | 7/1992 | Sakashita et al. | 326/158 |
| 5,204,560 | 4/1993 | Bredin et al. | 327/202 |
| 5,319,254 | 6/1994 | Goetting | 327/199 |
| 5,349,255 | 9/1994 | Patel | 327/203 |
| 5,444,404 | 8/1995 | Ebzery | 327/202 |
| 5,457,698 | 10/1995 | Segawa et al. | 371/223 |

FOREIGN PATENT DOCUMENTS

| | | | |
|---|---|---|---|
| 403204219 | 9/1991 | Japan | 327/211 |
| 403262317 | 11/1991 | Japan | 327/211 |

OTHER PUBLICATIONS

IBM Technical Disclosure Bulletin vol. 28, No. 7, Aug. 1983—"Set–Dominant Set Reset C550 Transfer gate CMOS Latch".
IBM Technical Disclosure Bulletin vol. 26, No. 38 Aug. 1983—"High Speed Latch".
IBM Technical Disclosure Bulletin, vol. 26, No. 12, May, 1984 pp. 6692–6693.
IBM Technical Disclosure Bulletin, vol. 28, No. 1, Jun. 1985 pp. 421–425.

*Primary Examiner*—Timothy P. Callahan
*Assistant Examiner*—T. Lam
*Attorney, Agent, or Firm*—Benman Collins & Sawyer

[57] ABSTRACT

A storage element responsive to static and dynamic input signals which generates complementary static and dynamic output signals and incorporates scan test logic. The invention includes a first circuit for receiving dynamic and static input signals and providing static output signals in response thereto and a second circuit connected to the first circuit for providing dynamic output signals. In the illustrative embodiment, the first circuit includes a static flip-flop constructed with a multiplexer, a static input (master) latch and a static output (slave) latch. The static input latch provides first and second intermediate complementary outputs on first and second intermediate output terminals respectively. In the illustrative embodiment, the second circuit is an arrangement which includes a first switching element with a first terminal connected to a first node, a control terminal responsive to the first intermediate complementary output signal and a third terminal for providing a third intermediate complementary output signal. The second circuit includes a second switching element having a first terminal connected to the first node, a control terminal responsive to a second complementary input signal and a third terminal for providing a fourth intermediate complementary output signal. The second circuit further includes a third switching element having a first terminal connected to the first node, a second terminal connected to a source of supply and a control terminal connected to a source of a clock signal.

16 Claims, 6 Drawing Sheets

| FIGURE 2B | FIGURE 2C |

STATIC/DYNAMIC FLIP-FLOP

FIELD OF THE INVENTION

The present invention relates to electronic circuits. More specifically, the present invention relates to dynamic logic circuits and the like.

BACKGROUND OF THE INVENTION

High performance complementary metal-oxide semiconductor (CMOS) very large scale integrated (VLSI) circuits are increasingly using dynamic logic gates to improve circuit performance. Dynamic logic gates are fast but require a frequent refresh to hold a logic state. Accordingly, because of the power and noise constraints on dynamic logic gates, many high performance CMOS VLSI must be designed with conventional static logic gates. Static circuits hold state without a frequent refresh. As power is consumed only when the inputs switch, static circuits consume less power. However, static circuits are generally slower than dynamic circuits. Hence, there is a current preference for dynamic gates in high performance circuits.

One solution is to mix static logic gates with dynamic logic gates. However, inasmuch as dynamic gates detect a pulse to sense a state while static gates sense an amplitude, it has been somewhat problematic to mix the two. That is, it has been difficult to provide circuit elements, particularly memory devices, which can generate and receive dynamic and static inputs.

In addition, the most area efficient dynamic gate implementations produce a single output that can not be easily complemented for those logic functions that require a "bar" or complemented signal. Also, certain manufacturing tests, such as scan testing, can not be used to verify the functionality of dynamic logic gates. Scan testing is an advantageous testing technique by which specific inputs and outputs are provided for the purpose of scan testing. However, scan testing is performed at much slower speeds than the operating speed of the circuit. During a scan test these inputs and outputs are interconnected and data is scanned in and read out. Scan testing can not be used with dynamic gates because the gates do not hold state but instead respond to pulses.

As the basic memory element in most logic is a flip-flop, there is a need in the art for a flip-flop that can accept or generate dynamic or static logic signals which can incorporate scan test logic circuitry.

SUMMARY OF THE INVENTION

The need in the art is addressed by the present invention which provides a storage element which provides responsive to static and dynamic input signals and generates complementary static and dynamic output signals while incorporating scan test logic circuitry. The invention includes a first circuit for receiving dynamic and static input signals and providing static output signals in response thereto and a second circuit connected to the first circuit for providing dynamic output signals.

In the illustrative embodiment, the first circuit includes a static flip-flop constructed with a multiplexer, a static input (master) latch and a static output (slave) latch. The static input latch provides first and second intermediate complementary outputs on first and second intermediate output terminals respectively.

In the illustrative embodiment, the second circuit is an arrangement which includes a first switching element with a first terminal connected to a first node, a control terminal responsive to the first intermediate complementary output signal and a third terminal for providing a third intermediate complementary output signal. The first circuit further includes a multiplexer for switching between input data and test data for input into the static input latch. The first circuit further includes a static output latch connected to the static input latch and a static output buffer connected to the static output latch.

The second arrangement includes a second switching element having a first terminal connected to the first node, a control terminal responsive to a second complementary input signal and a third terminal for providing a fourth intermediate complementary output signal. The second arrangement further includes a third switching element having a first terminal connected to the first node, a second terminal connected to a source of supply and a control terminal connected to a source of a clock signal. A first output buffer is connected to the third terminal of the first switching element and a second output buffer is connected to the third terminal of the second switching element. Each of the output buffers is a dynamic output buffer.

DESCRIPTION OF THE INVENTION

The present invention is directed toward an improvement in flip-flops. The following description is presented to enable one of ordinary skill in the art to make and use the invention and is provided in the context of a patent application and its requirements. Various modifications to the preferred embodiment will be readily apparent to those skilled in the art and the generic principles herein may be applied to other embodiments. Thus, the present invention is not intended to be limited to the embodiment shown but is to be accorded the widest scope consistent with the principles and features described herein.

The present invention is a design which combines the elements of both dynamic and static storage elements in a manner that minimizes the performance impact of circuitry ordinarily necessary to generate complementary signals, static outputs and scan test logic on the dynamic data path.

The organization of the signal flow is pertinent to the objective of maximizing the performance (especially of the dynamic data). Both the number of stages in the data paths and the amount of loading on the critical performance limiting nodes is minimized in the manner discussed more fully below. This affords improved performance at the expense of transistor count in the input stage.

Figure 1:
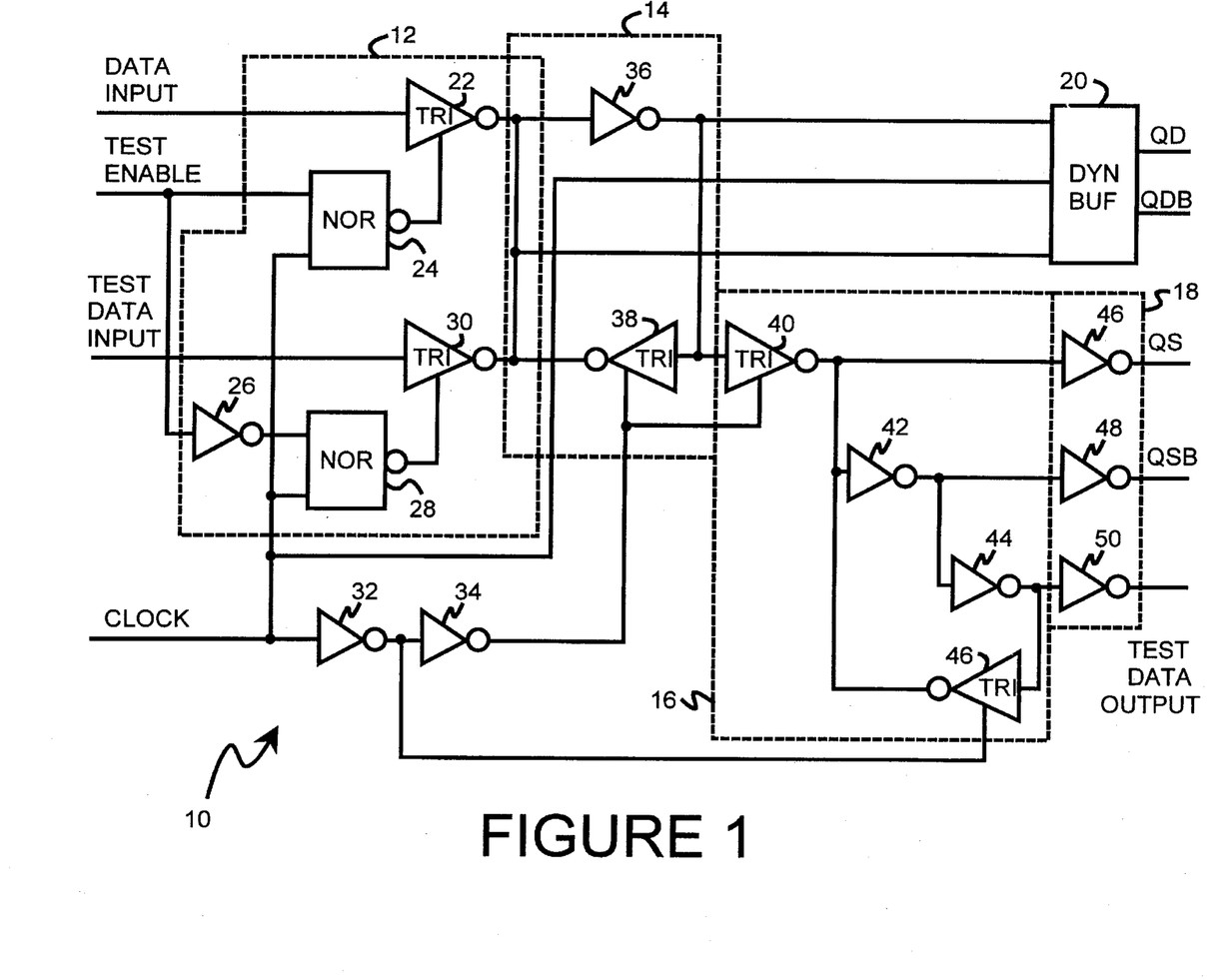
FIG. 1 is a block diagram of an illustrative implementation of the storage element of the present invention with test logic.

FIG. 1 is a block diagram of an illustrative implementation of the storage element 10 of the present invention with test logic. The storage element 10 includes a multiplexer 12, a static input latch 14 which serves as a master, a static output latch 16 which slaves off of the master, a set of static output buffers 18 and a dynamic output buffer 20. The multiplexer 12, static input latch 14 and static output latch 16 are of conventional design. Input data and test data are multiplexed into the input latch 14 by the multiplexer 12. The multiplexer 12 provides scan test logic and includes a first tri-state buffer 22 which provides the data input to the input latch 14 under control of a first NOR gate 24. Inputs to the NOR gate 24 are provided by a 'test enable' signal and a clock signal. The test enable signal is also input to a second NOR gate 28 via a first inverter 26. The second NOR gate 28 receives a clock input as the second input thereto and enables a second tri-state buffer 30 which provides test data to the input latch 14. Thus, the test enable signal's effect is to cause the multiplexer to select either input data or test data for input to the latch 14.

The input latch 14 is a standard latch configuration comprising two static inverters 36 and 38 connected in a feedback arrangement. The second inverter 38 is enabled by the clock via two inverters 32 and 34.

The output of the master input latch 14 is input to the slave latch 16 via a fourth tri-state buffer 40 which is also enabled by the clock output of the inverter 34. The output latch includes fourth and fifth inverters 42 and 44 connected in series with the output of the fourth buffer 40. The output of the buffer 40 is input to a first static output buffer 46 which provides a first static output signal 'QS'. The output of the inverter 42 is input to a second static output buffer 48 which provides a second static output signal 'QSB' which is the complement of the first static output signal 'QS'. The output of the inverter 44 is input to a third static output buffer 50 which provides the test data output. The output of the inverter 44 is also input to the tri-state buffer 46 the output of which is connected to the output of the fourth static buffer 40. The tri-state buffer 46 is enabled by the output of the inverter 32, the complement of the clock pulse.

In accordance with the present teachings, the present invention also provides complementary dynamic output signals 'QD' and 'QDB'. These signals are provided by the dynamic output buffer 20 in response to the intermediate complementary outputs from the static input latch 14 and the clock input. The design of the dynamic output buffer 20 is described in copending application entitled DYNAMIC LOGIC CIRCUIT FOR GENERATING COMPLEMENTARY OUTPUTS, Ser No. 08/445,490, filed May 22, 1995, by the present applicant, the teachings of which are incorporated herein by reference. The design of the dynamic output buffer 20 is best appreciated with reference to FIG. 2.

Figure 2:
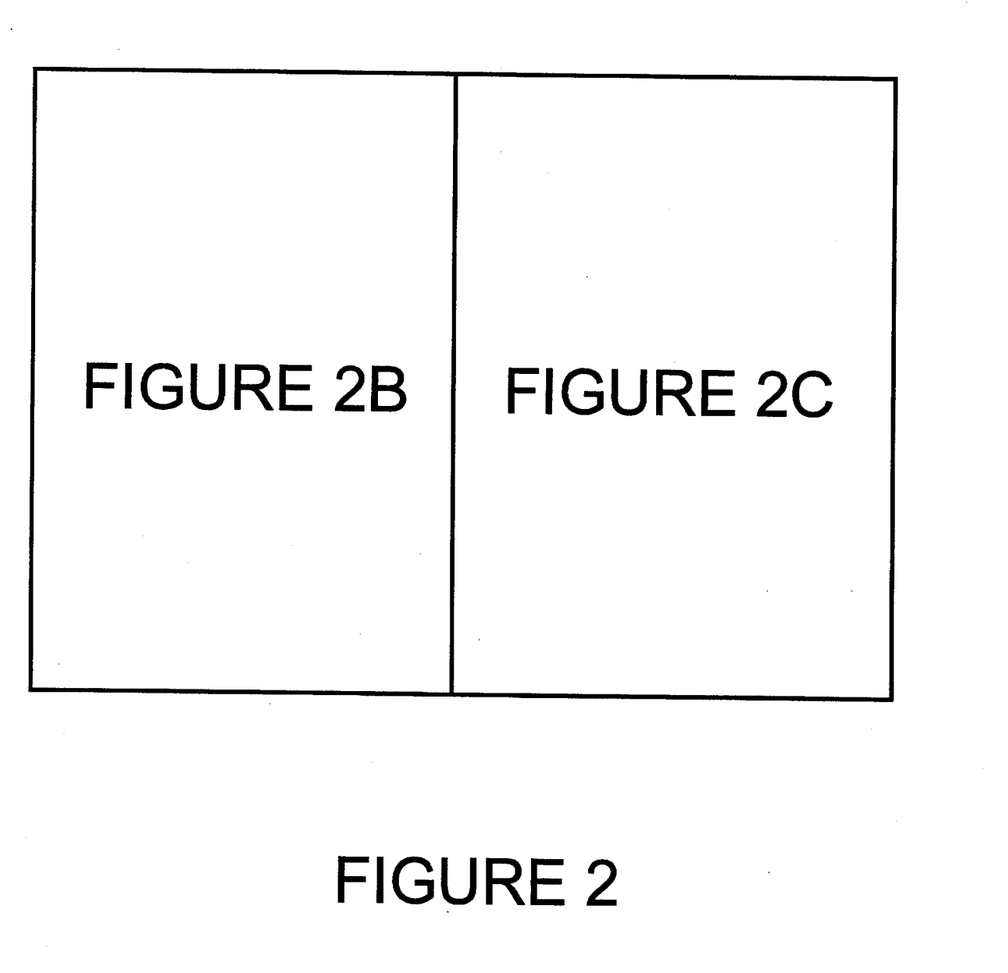
FIGS. 2B and 2C are schematic diagrams of an illustrative implementation of the storage element of the present invention with test logic.
FIG. 2a is a timing diagram illustrating the operation of the present invention in respect to an input signal.

FIG. 2 is a schematic diagram of an illustrative implementation of the storage element 10 of the present invention with test logic. As illustrated in FIG. 2, the dynamic output buffer 20 includes first and second n-channel CMOS transistors N18 and N19. The first transistor N18 has a source terminal connected to a first node, node A, a control terminal, responsive to a first complementary input signal provided by the master input latch 14, and a drain terminal from which a first intermediate dynamic complementary output signal is provided. Similarly, the second transistor N19 has a drain terminal connected to node A, a control terminal responsive to a second intermediate dynamic complementary input signal from the master latch 14 and a third terminal for providing a second complementary output signal.

The dynamic output buffers are merged by employing a single n-channel device (N17) instead of two devices as would be conventional. This is allowed due to the orthogonality of the data and minimizes the input clock capacitance. The single clock transistor N17 connects the source terminals of the first and second transistors N18 and N19 to ground via the source/drain connection thereof. The gate terminal of N17 is connected to the clock (not shown). N17 implements a current sharing function by which the discharge through the first and second transistors is slowed sufficiently so that even, if the complementary inputs are transitioning, the possibility of generating output signals from both buffers simultaneously is significantly reduced. The use of the unbuffered clock offers a reduction in the output delay from the clock to the dynamic data outputs with no additional hazard in falsely generating non-orthogonal outputs due to the feedback transistors P18 and P19, the merged nature of the circuit, and careful device sizing. It should be noted that the use of an unbuffered clock that may have a slower rise time than a buffered clock has minimal effect in output delay versus transition time due to the lower than normal switching threshold of dynamic gate inputs.

The drain terminals of the first and second transistors N18 and N19 are connected to first and second dynamic output buffers 52 and 54 respectively. The first buffer 52 includes a first inverter 56 consisting of a p-channel MOSFET (metal-oxide semiconductor, field effect transistor) P19 and an n-channel transistor N20 connected in series between a source of supply (e.g. VDD) and ground. The input terminals of P19 and N20 are connected to the third terminal of the first transistor N18. A second p-channel MOSFET P18 is connected between VDD and the input terminal of the first inverter 56. The gate of the second MOSFET P18 is connected to the output of the inverter 56.

The second buffer 54 is of similar design as the first buffer 52 and includes a second inverter 58 consisting of transistors P21, P22 and N21.

Transistors P17 and P20 provide a precharging circuit. Transistor P17 is connected between VDD and the input to the first buffer 52 and transistor P20 is connected between VDD and the input to the second buffer 54. The gates of P17 and P20 are connected to the clock (not shown).

The stage driven by the test data input (P11–12, N11–12) is sized at minimum layout geometry to reduce the parasitic load at the output of the functional data input stage since the setup time for test data is noncritical. The functional data input stage (P4–5, N4–5) is sized to favor the dynamic versus static performance (or balance between the two) by adjusting the ratio between P4–5 and N4–5. The input latch feedback stage (P13–14, N13–14) is sized toward minimums to again control capacitance, but is also balanced with the clock buffers (P1–3 and N1–3, P8–9 and N8–9, P10 and N10, and P15–16 and N15–16) to minimize the possibility of generating output glitches if the input switches around the minimum functional setup time.

The static and test output stage 18 is a conventional static design. The use of the clocked inverter versus a transmission gate followed by an inverter improves performance, again due to the lower parasitic capacitances of this layout. In addition, it minimizes the performance impact of adding a static stage in parallel with the dynamic stage by minimizing the capacitance loading at the output of the inverter P6 and N6. Note that the outputs are fully buffered to eliminate the effects of output loading on both other outputs and the minimum pulse width in the high state of the clock.

Figure 2A:
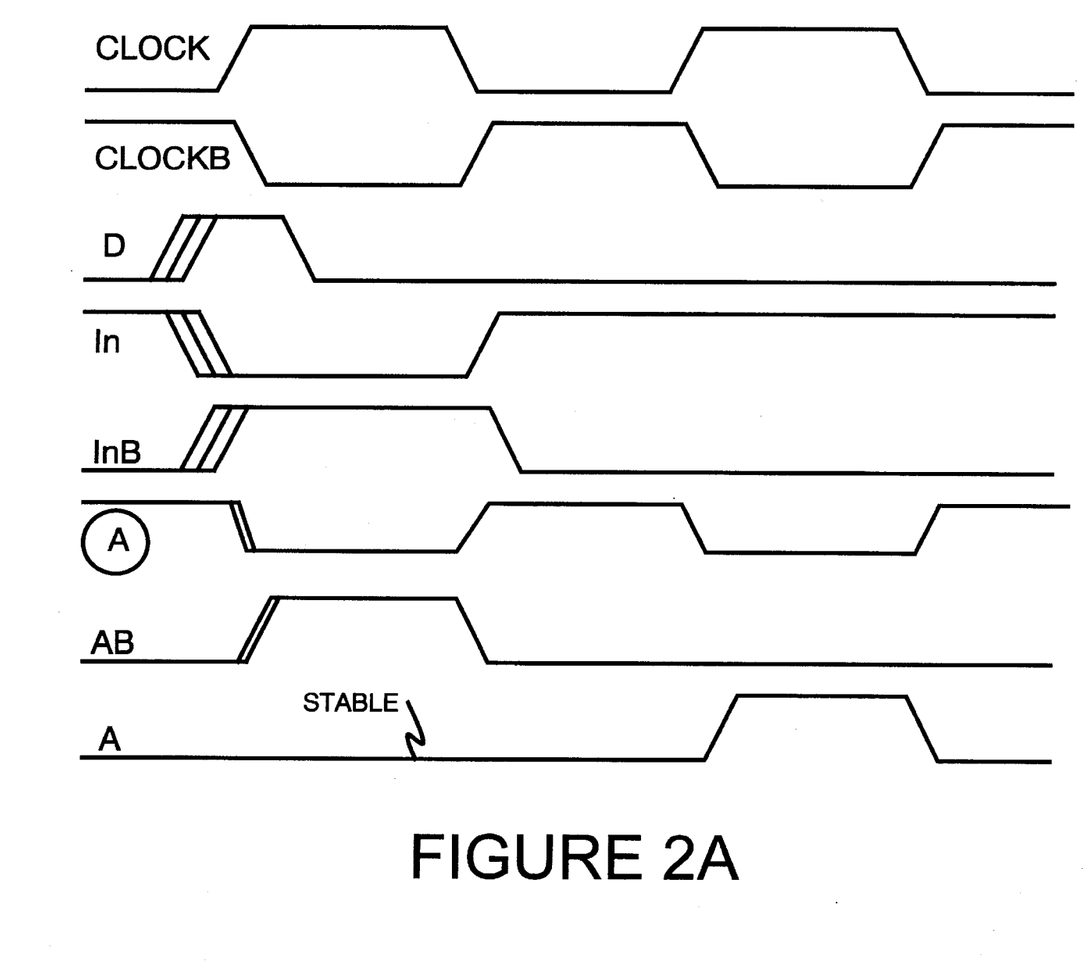
Figure 2B:
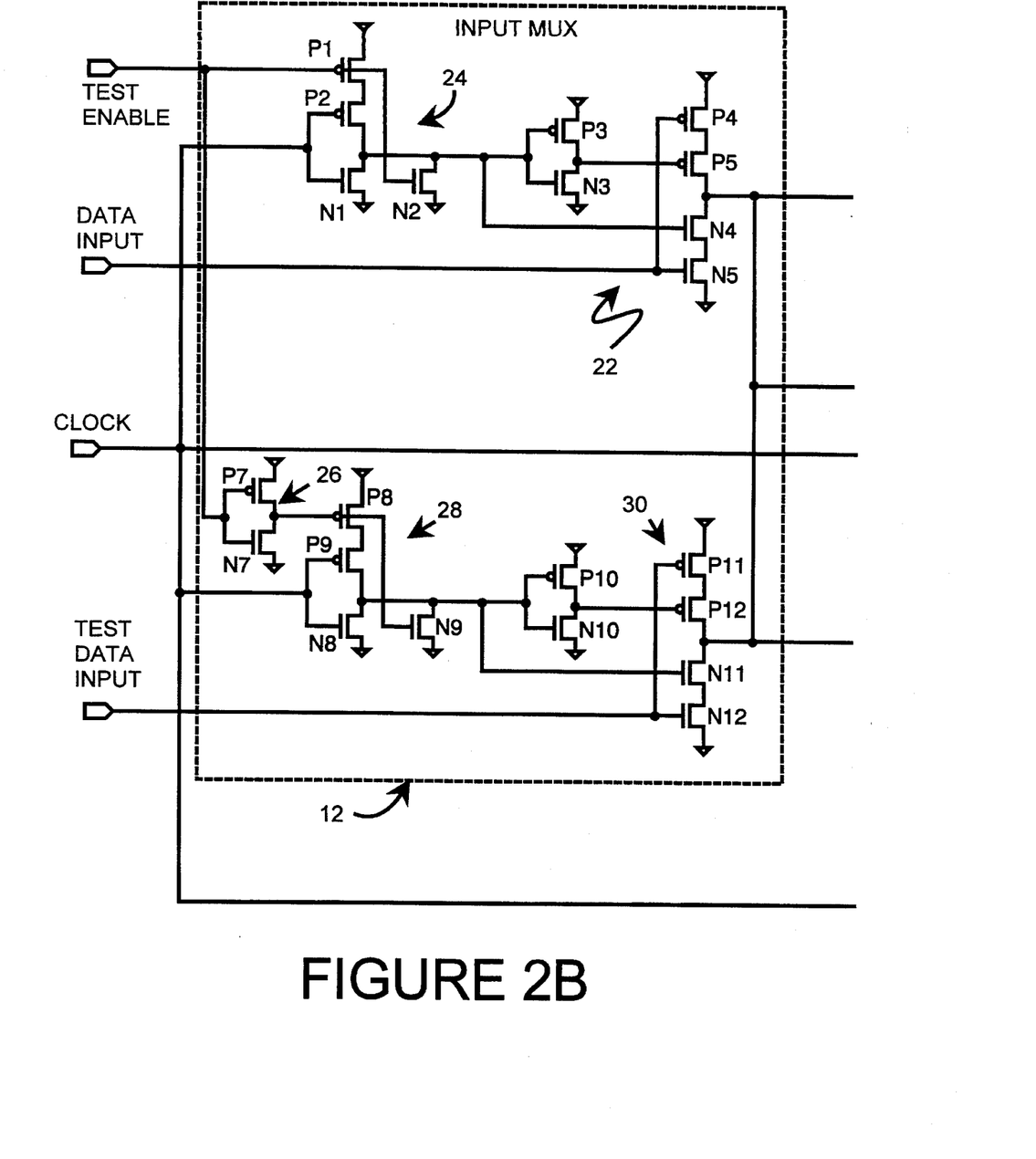
Figure 2C:
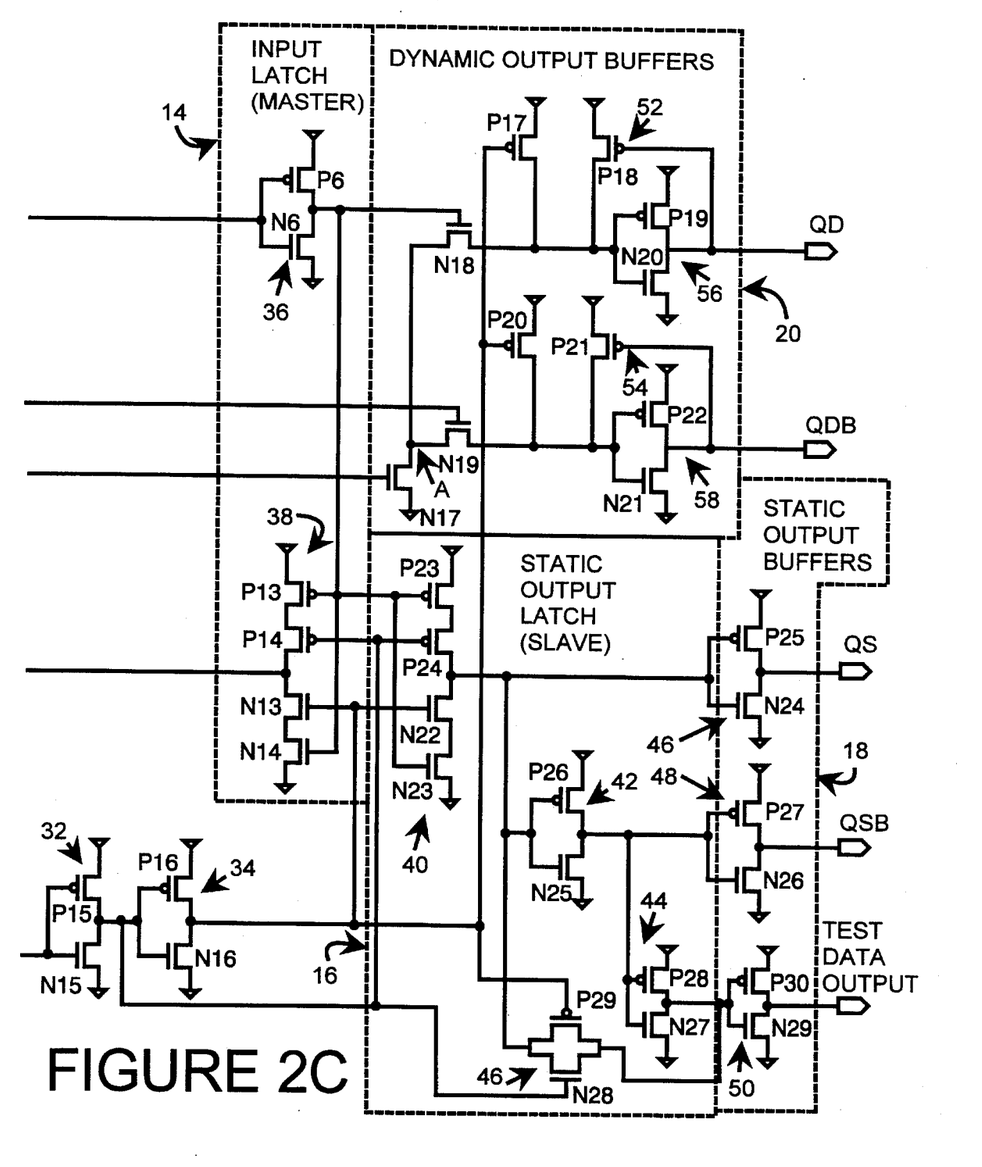

To more fully understand the operation of circuits of FIGS. 1 and 2, refer now to FIG. 2a which is a timing diagram of its operations.

Returning to FIG. 1, both the functional data and the test data inputs feed tri-state inverters 22 and 30 controlled by separate gated clocks. This offers improved performance for the functional data input by providing the multiplexing function between functional and test data by controlling the nonperformance limiting test clock versus conventional flip-flops that either utilize a separate multiplexer in the data path or combine these two tri-state buffers together into one block.

Functionally, at the rising edge of the input clock, the input tri-state buffers 22 and 30 are turned off, the feedback tri-state inverter is enabled which latches the input value and data is propagated to all outputs. Note that the tri-state buffer 22 can receive static or domino-type dynamic signals. The input(s) are captured during the period while the clock is low. As is seen in FIG. 1a, data is required to be valid just prior to the clock rising, defined as the setup time. The exact setup time required is controlled by the relative delays between the paths through the input multiplexer 12 and following inverter 36 versus the path from the clock to the control input of the feedback tri-state inverter 38. A corresponding data hold time is required controlled by the same relative timing paths. If the setup time is violated, the issue of output glitches is resolved in the circuit design by controlling relative timings of the clock paths, output dynamic buffers and static output latch as will be appreciated by one skilled in the art. The input latch design is key to minimizing metastability problems. Partial levels caused by violating minimum setup hold times are almost certainly resolved by this structure, although not totally eliminated as is the case in the vast majority of latch designs.

As illustrated in FIG. 2, the dynamic outputs are driven by the merged pair of dynamic buffers 20 driven directly by the clock input. By taking advantage of the orthogonality of the data, the buffers can be merged which offers improved clock to output delays while decreasing clock input capacitance. The static functional and test data outputs are driven from a tri-state inverter 40 enabled by the buffered clock that then drives additional buffer inverters that drive the outputs. This output stage is also static since it holds its state while the clock is low, which enables low speed or true static operation. The buffered clock is used to decrease the capacitance of the clock input.

The circuit may be implemented using a conventional submicron CMOS digital logic processes. In the illustrative embodiment, the tri-state inverters are implemented as a single clocked inverter stage (e.g., P4–5 and N4–5). This minimizes the total parasitic capacitance versus an inverter followed by a complementary transmission device due to the elimination of a pair of contacts and the general ease of layout of this structure.

Figure 3:
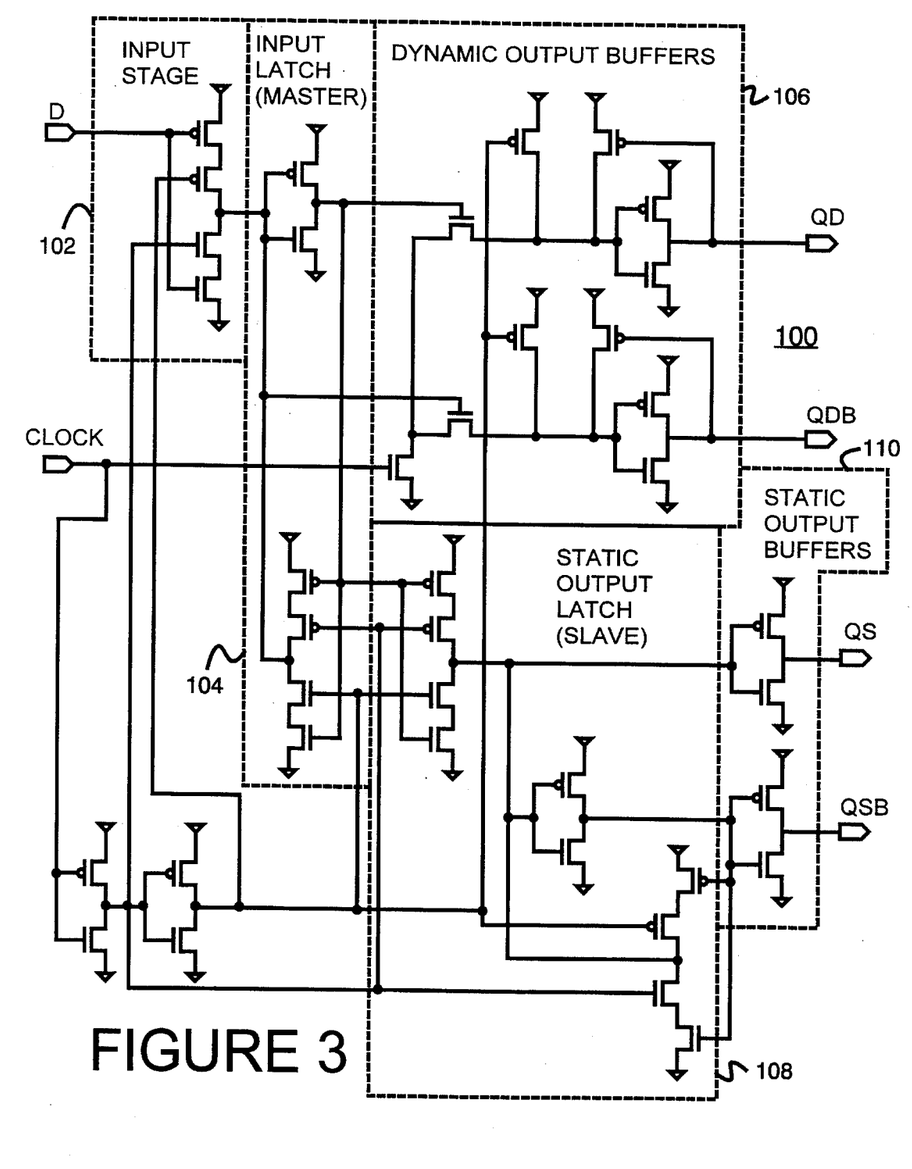
FIG. 3 is a schematic diagram of an illustrative implementation of the storage element of the present invention without test logic.

FIG. 3 is a schematic diagram of an illustrative implementation of the storage element 100 of the present invention without test logic. The storage includes an input stage 102 for receiving a data signal which in turn is coupled to an input latch stage 104. The input latch stage 104 is coupled to a dynamic output buffer stage 106 and to static output latch 108. The static output latch 108 in turn is coupled to an static output buffer stage 110. The changes illustrated in FIG. 3 simplify the circuit for those applications that do not require test logic while maintaining the innovations aimed at minimizing the impact of the static outputs and creating complementary dynamic outputs on performance. Although not illustrated for brevity, if the static outputs are also not required, the static output latch 108 and buffers 110 can also be eliminated. The resulting circuit will still produce a flip-flop with orthogonal dynamic outputs and fully static operation.

Thus, the present invention has been described herein with reference to a particular embodiment for a particular application. Those having ordinary skill in the art and access to the present teachings will recognize additional modifications applications and embodiments within the scope thereof. For example, while the illustrative embodiment presumes that the rising edge of the clock is the active edge, those skilled in the art will appreciate that the basic concepts and the implementation details of the illustrative embodiment are directly applicable to the use of the trailing edge of the clock pulse as the active edge without departing from the scope of the present teachings.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

I claim:

1. A storage element comprising:

first means for receiving dynamic and static input signals and providing static output signals in response thereto, the first means including a static flip-flop coupled to a static input latch for providing first and second intermediate complementary outputs on first and second intermediate output terminals, respectively; and second means connected to the first and second intermediate output terminals for providing dynamic output signals, the second means including, a first switching element having first terminal connected to a first node, a control terminal responsive to the first intermediate complementary output signal and a second terminal for providing a third intermediate complementary output signal, a second switching element having a first terminal connected to the first node, a control terminal responsive to the second intermediate complementary output signal and a second terminal for providing a fourth intermediate complementary output signal, and a third switching element having a first terminal connected to the first node, a second terminal connected to ground and a control terminal connected to a source of a clock signal.

2. The invention of claim 1 wherein said second means further includes a fourth switching element having a first terminal connected to a source of supply, a second terminal connected to the second terminal of the first switching element and a control terminal connected the source of a clock signal.

3. The invention of claim 2 wherein said second means further includes a fifth switching element having a first terminal connected to the source of supply, a second terminal connected to the second terminal of the second switching element and a control terminal connected the source of a clock signal.

4. The invention of claim 1 wherein said second means further includes a first output buffer connected to the second terminal of the first switching element and a second output buffer connected to the second terminal of the second switching element.

5. The invention of claim 4 wherein each of the output buffers is a dynamic output buffer.

6. The invention of claim 1 wherein the first means further includes means for multiplexing input data and test data into the static input latch.

7. The invention of claim 1 wherein the first means further includes a static output latch connected to the static input latch.

8. The invention of claim 7 wherein the first means further includes a static output buffer connected to the static output latch.

9. A static/dynamic storage element comprising:

first means for receiving dynamic and static input signals and providing static output signals in response thereto, said first means including a static input latch for providing first and second intermediate complementary outputs on first and second intermediate output terminals, respectively; and second means connected to the first and second intermediate output terminals for providing dynamic output signals, said second means including:

a first switching element having a first terminal connected to a first node, a control terminal responsive to the first intermediate complementary output signal and a second terminal for providing a third intermediate complementary output signal;

a second switching element having a first terminal connected to the first node, a control terminal responsive to the second intermediate complementary output signal and a second terminal for providing a fourth intermediate complementary output signal; and a third switching element having a first terminal connected to the first node, a second terminal connected to ground and a control terminal connected to a source of a clock signal.

10. The invention of claim 9 wherein said second means further includes a fourth switching element having a first terminal connected to a source of supply, a second terminal connected to the second terminal of the first switching element and a control terminal connected the source of a clock signal.

11. The invention of claim 10 wherein said second means further includes a fifth switching element having a first terminal connected to the source of supply, a second terminal connected to the second terminal of the second switching element and a control terminal connected the source of a clock signal.

12. The invention of claim 11 wherein said second means further includes a first output buffer connected to the second terminal of the first switching element and a second output buffer connected to the second terminal of the second switching element.

13. The invention of claim 12 wherein each of the output buffers is a dynamic output buffer.

14. The invention of claim 11 wherein the first means further includes means for multiplexing input data and test data into the static input latch.

15. The invention of claim 11 wherein the first means further includes a static output latch connected to the static input latch.

16. The invention of claim 15 wherein the first means further includes a static output buffer connected to the static output latch.

\* \* \* \* \*